United States Patent [19]

Harris et al.

[11] 4,359,360

[45] Nov. 16, 1982

[54] APPARATUS FOR SELECTIVELY JET ETCHING A PLASTIC ENCAPSULATING AN ARTICLE

[75] Inventors: Herbert M. Harris, Duluth; Gerald N. Hill, Marietta, both of Ga.

[73] Assignee: The United States of America as represented by the Secretary of the Air Force, Washington, D.C.

[21] Appl. No.: 329,459

[22] Filed: Dec. 10, 1981

[51] Int. Cl.³ .................. B41C 1/00; B44F 1/22; C03C 15/00; C03C 25/06

[52] U.S. Cl. ............................. 156/345; 29/575; 156/640; 156/655; 156/668

[58] Field of Search .............. 156/345, 640, 344, 584, 156/655, 668; 29/575; 134/105, 198

[56] References Cited

U.S. PATENT DOCUMENTS

| | | | |
|---|---|---|---|
| 2,937,124 | 5/1960 | Vaughan | 204/143 |
| 3,012,921 | 12/1961 | Vaughan | 156/17 |
| 3,039,514 | 6/1962 | Swartzman | 156/345 |
| 3,953,265 | 4/1976 | Hood | 156/345 X |
| 3,969,813 | 7/1976 | Minetti et al. | 29/575 |
| 4,089,704 | 5/1978 | Heiss | 156/668 |

Primary Examiner—William A. Powell
Attorney, Agent, or Firm—Donald J. Singer; Jacob N. Erlich

[57] ABSTRACT

An apparatus for selectively jet etching a plastic which is encapsulating an article (i.e., a device, assembly, and the like). This apparatus accomplishes the elimination of the prior art problems and disadvantages by confining the etching to a preselected portion (i.e., the desired region) of the plastic encapsulation, by causing a turbulent flow of the etchant which in turn causes great mechanical agitation of the etchant and thereby results in complete etching of the plastic encapsulant, and by providing a completely closed systemic apparatus which thereby inherently precludes any danger to the personnel using the inventive apparatus.

10 Claims, 1 Drawing Figure

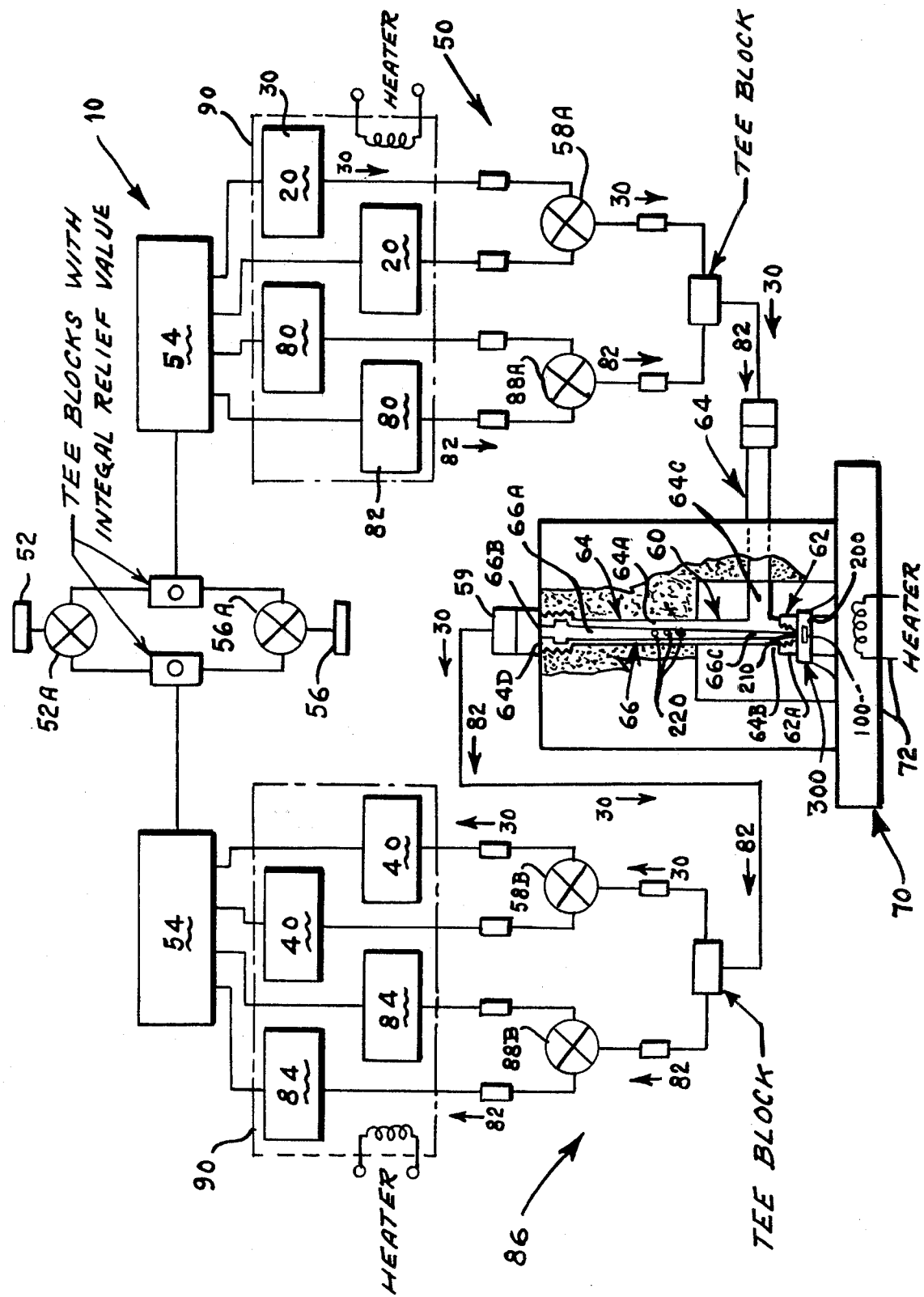

APPARATUS FOR SELECTIVELY JET ETCHING A PLASTIC ENCAPSULATING AN ARTICLE

STATEMENT OF GOVERNMENT INTEREST

The invention described herein may be manufactured and used by or for the Government for governmental purposes without the payment of any royalty thereon.

BACKGROUND OF THE INVENTION

This invention relates to etching and more particularly to an apparatus for selectively jet etching a plastic which is encapsulating an article, such as an epoxy encapsulated monolithic integrated circuit assembly chip, so that a preselected portion of the encapsulating material (i.e., the encapsulant) can be removed, exposing the previously encapsulated article, so that the article can be tested, used, studied and the like.

Before the advent of the instant invention, prior art de-encapsulation techniques consisted of either immersing the entire encapsulation in a container of etchant, or of mechanically removing selected portions of the encapsulant and then immersing the article together with the remaining adhering encapsulant in an etchant.

Both of these techniques resulted in overall damage to the exterior of the article that had been encapsulated. The exterior damage was of such a nature that it precluded subsequent operation of the article. In addition, mechanical agitation of the etchant was minimal, and incomplete removal of the plastic encapsulant often occurred. Further, the safety of personnel using these prior art techniques was endangered because they were exposed, of necessity, to open containers of hazardous chemicals.

SUMMARY OF THE INVENTION

By totally eliminating the aforesaid problems and disadvantages, and others relative thereto, the instant invention constitutes a significant advance in the state-of-the-art.

The apparatus of this invention is capable of selectively jet etching a plastic which is encapsulating an article, such as an epoxy encapsulated mono-lithic integrated circuit assembly chip, so that the article can be de-capsulated without damage and thereafter can be tested, used, and studied. The apparatus includes a source of heated etchant; a receiving receptacle to accept and hold the etchant which flows from the source; a selectively controllable flow path from the etchant source to the receiving receptacle, with the path being defined by tubes and associated components made of chemically inert material, such as "Teflon" and/or glass, and with the path having a vacuum source at one end and an atmospheric inlet at the other end; and, a jet spray assembly operably connected to the flow path at an appropriate location between the etchant source and the etchant receiving receptacle, with this assembly so structured as to cause a jet spray of the heated etchant to strike at high velocity, and to cause the removal of, a preselected portion of the plastic encapsulant, thereby de-encapsulating the article non-destructively. The apparatus may be used with a rinse solution. The structure of the flow path is such that the flow may be reversed, returning the etchant or rinse solution to their respective sources from their respective receiving receptacles. The apparatus confines etching to the preselected region of the encapsulant; creates a turbulent flow which results in complete etching; and, because it is completely closed, prevents exposure of user personnel to the open containers of hazardous chemicals used in the prior art.

Accordingly, it is an object of the instant invention to provide a novel apparatus for etching a preselected portion of a plastic which is encapsulating an article, and for confining the etching to the preselected portion.

It is another object of this invention to cause a turbulent flow of the etchant which results in great mechanical agitation of the etchant, thereby attaining complete etching of the preselected portion of the plastic (which is encapsulating the article) and exposing the article.

It is still another object of the instant invention to provide a closed systemic apparatus, thereby preventing the exposure of personnel using the apparatus to hazardous chemicals, and thereby assuring the safety of these user personnel.

It is yet another object of this invention to provide an apparatus which not only attains the aforesaid objects, but also is non-destructive of the encapsulated article and permits its testing, use, study, and the like after exposure of and/or removal of the article from the encapsulant.

These objects of the instant invention, as well as other related objects thereof, will become readily apparent after a consideration of the description of the invention, together with reference to the single FIGURE of the drawing.

DESCRIPTION OF THE DRAWING

The drawing is a single FIGURE which depicts, in simplified pictorial and schematic form, a preferred embodiment of the instant invention. In the interest of clarity, the FIGURE is partially the side elevation view and partially in top plan view.

DETAILED DESCRIPTION OF THE PREFERRED EMBODIMENT

With reference to the FIGURE of the drawing, therein is shown in simplified form a preferred embodiment 10 of the instant invention. In the most basic and generic structural form, the instant invention 10, which is an apparatus for selectively jet etching a plastic material 200 which is encapsulating an article 100 (such as monolithic integrated circuit assembly chip) which forms a package 300, is made up of: at least one source 20 of a heated etchant 30; at least one receptacle 40 in communication with the source 20 of the heated etchant 30 for receiving (i.e., "catching") and storing (i.e., "holding") a flow of the heated etchant 30; means (generally designated 50) for controlling the flow of the heated etchant 30 from its source 20 to the receptacle 40, with this means 50 interconnecting the source 20 and the receptacle 40; means (generally designated 60) for causing a high velocity jet flow of the flowing heated etchant 30 to spray against a preselected portion 210 (i.e., a predetermined region) of the plastic encapsulant 200 of the article 100, with this means 60 connected to the etchant flow controlling means 50, and with this means 60 including a means 62 for defining the preselected portion 210 of the encapsulant 200, and also including a means 64, connected to means 62, for directing a jet spray of flowing heated etchant 30 against the preselected portion 200; and means 66 for removing the etchant 30, for removing the plastic encapsulant 200 which is dissolved by the etchant, and also for removing any insolvable particles 220 of the plastic encapsulant 200, all of which result from the jet spraying of the preselected portion 210 of the plastic encapsulant 200, with this means 66 operably connected to the jet spray means 60 and to the etchant flow controlling means 50.

The etchant flow controlling means 50 includes a selectively operable vacuum source 52 (which preferably includes at least one vacuum manifold 54) connected to the receiving receptacle 40, and an atmospheric vent 56 connected to the source 20 of the heated etchant 30. The preferred vacuum source 52 is a water flow aspirator.

The means 62 for defining the preselected portion 210 of the plastic encapsulant 200 includes a washer 62A which is made of chemically inert material (such as is commercially available as "Teflon") and which has a hole therethrough of dimensions such that the hole surrounds the preselected portion 210 which is to be de-encapsulated by jet spray etching.

The means 64 for directing the jet spray of flowing heated etchant 30 against the preselected portion 210 of the encapsulant 200 includes a main tube 64A which is made of chemically inert material (preferably glass), and which has a (lower) end opening 64B that is disposed in the hole of the washer 62A and a said opening 64C that is operably connected to the etchant flow controlling means 50.

The means 66 for removing the etchant 30, the dissolved plastic encapsulant, and the insoluable plastic particles 220 after etching includes a tapered capillary tube 66A which is made of chemically inert material (such as glass) and which is positioned within the main tube 64A. The capillary tube 66A has an upper open end 64B in communication with the etchant flow controlling means 50, and is sealed to the upper opening 64D of the main tube 64, effectively closing off that opening 64D. The capillary tube 66A also has a lower end opening 66C, with the tube 66A being tapered from the upper opening 66B to the lower opening 66C. The tapered lower opening 66C is disposed through the lower open end 64B of the main tube 64A, and is concurrently disposed within the hole of the washer 62A.

The package 300 of the encapsulant 200 and of the article 100 within the encapsulant 200, the jet spray causing means 60, and the etchant and plastic removing means 66 are all supported by support means 70 which preferably includes a heated support platen 72.

The instant invention 10 also preferably includes at least one source 80 of a heated rinse solution 82, at least one receptacle 84 in communication with the heated rinse solution for receiving and storing a flow of the heated rinse solution, and means 86 (common to and connected with the etchant flow controlling means 50) for permitting the selective flow either of the heated etchant 30 or of the heated rinse solution 82 from their respective sources 20 and 80 to their respective receiving receptacles 40 and 84. In this regard, it is to be remembered that the etchant 30 and the rinse solution 82 are made to flow at different times, and therefore that some structural portions defining their respective flow paths are the same, i.e., are used in common.

As can be seen from the FIGURE, the preferred embodiment 10 preferably further comprises a plurality of sources 20 of heated etchants 30. The etchants 30 are different and are predetermined by the user based upon need thereof. Likewise, since a plurality of sources 80 of heated rinse solutions 82 may be desired or needed, the preferred embodiment is structured to meet this desire or need. For each of the sources 20, 80 there is a separate receiving receptacle 40, 84.

As a matter of preference, the means 60 for causing a high velocity jet flow of the flowing heated etchant 30 (or of the rinse solution 82) to spray against the preselected portion 210 of the plastic 200 which is encapsulating the article 100, and the means 66 for removing the etchant, the dissolved plastic, and the insoluable particles of plastic are joined to form a novel assembly, hereinafter referred to as the "jet tube assembly", 60, 66.

Also as a matter of preference, the sources 20, 80, containing respectively the etchants 30 and the rinse solutions 82 are flasks, total four in number, are disposed on the "right" in the FIGURE, and are mounted on a heated platen 90. The receiving receptacles 40, 84 for respectively receiving the etchants 30 and the rinse solutions 82 are also four in number, with one receiving flask for each source flask, and with these flasks disposed on the "left" in the FIGURE and mounted on another heated platen 90. Each flask has a three-hole "Teflon" stopper (one hole fitted with a plug) and a "Teflon" baffle. "Teflon" tubing connects the flasks to vacuum manifolds 54 which, in turn, are connected by "Teflon" tubing to "Teflon" tee blocks that have an integral pressure relief valve. A "Teflon" fitting 59 connects the "left" side of the apparatus 10 to the jet tube assembly 60, 66, and tightening this fitting 59 lowers the jet tube assembly into place.

MANNER OF USE OF THE PREFERRED EMBODIMENT

The manner of use, and of operation, of the preferred embodiment of the instant invention 10, as shown in the FIGURE, can be easily ascertained by any person of ordinary skill in the art from the foregoing description, coupled with reference to the contents of the FIGURE. As a related matter, it will probably be of interest to those of ordinary skill in the art that tests have been made using the preferred embodiment shown in the FIGURE, and using packages (such as 30) of plastic (such as 200) encapsulating a monolithic integrated circuit assembly chip (such as article 100) which was wholely contained with the preselected portion (such as 210) of the encapsulant. These tests have resulted in non-destructive complete exposure and removal of the chip from the encapsulant, and the subsequent successful testing, use, and study of the de-encapsulated chip.

For those not of the art, the following explanation of the use and operation of the preferred embodiment 10, as shown in the FIGURE, is given.

The package 300 of the article 100 encapsulated in plastic 200 is mounted on the heated support platen 72, and is positioned under the washer 62A such that the hole of the washer 62A surrounds and is in contact with the preselection portion 210 of the plastic encapsulant which is to be de-capsulated by etching.

Next, the common port of the vacuum source valve 52A is connected to the vacuum source 52.

The desired etchant 30 is selected from its source 20 by opening the stopcock valve 58A, and the appropriate receiving receptacle 40 is selected by opening stopcock valve 58B.

Then, the common port of the atmospheric vent valve 56A is connected to the tee block and to the appropriate vacuum manifold 54.

The vacuum source valve 52A is adjusted such that vacuum is applied to the appropriate receiving receptacle 80, with a heated etchant flow path 30 being thus established.

Etchant 30 from its source 20 flows through the stopcock 58A, through the tee block, and into the jet tube assembly 60, 66. As the etchant 30 leaves its source 20, air from the atmospheric vent 56 enters the source 20 and fills it.

Etchant 30 flows into the jet tube assembly 60, 66 and sprays onto, and strikes, the preselected portion 210 of the package 30.

Etchant 30 and dissolved plastic are pulled through the capillary tube 66A by the vacuum created by vacuum source 52 and are further pulled into the appropriate receiving receptacle 40.

As the etchant 30 cycles through the inventive apparatus 10, it comes in direct contact with the preselected portion 210 of the package 300 which is defined by the hole in the washer 62A and which is exposed within the hole.

Proper selection of the etchant(s) 30 results in the etching of the plastic 200 in the localized region 210 of the package 300, and also results in the removal of de-encapsulated, but insoluable, particles 220 of the plastic 200 by the high velocity flow of the etchant through the jet tube assembly 60, 66.

It is to be noted that the flow of the etchant 30 can be reversed (i.e., from the appropriate receiving receptacle 40 back to the appropriate source 20) simply by switching vacuum source valve 52A to the "right side" tee block and to "right side" vacuum manifold 54, and also switching atmospheric vent value 56A to the "left side" tee block and to the "left side" vacuum manifold 54.

It is also to be noted that the procedure for using (i.e., flowing, receiving, storing, and reversing the flow) the rinse solution 82 is the same as the above-described procedure for using the etchant 30.

CONCLUSION

It is abundantly clear from all of the foregoing, and from the contents of the single FIGURE of the drawing, that the stated objects of the instant invention 10, as well as other objects related thereto, have been achieved.

It is to be noted that, although there have been described and shown the fundamental and unique features of the instant invention, as applied to a preferred embodiment 10, nevertheless various other embodiments, variations, adaptations, substitutions, additions, omissions, and the like may occur to and can be made by those of ordinary skill in the art.

What is claimed is:

1. Apparatus for selectively jet etching a material which is encapsulating an article, comprising:
a. at least one source of a heated etchant;
b. at least one receptacle in communication with said source of heated etchant for receiving and storing a flow of said heated etchant;
c. means for controlling said flow of heated etchant from said source thereof to said receptacle, with this means interconnecting said source and said receptacle;
d. means connected to said etchant flow controlling means, for causing a high velocity jet flow of said flowing heated etchant to spray against a preselected portion of said material encapsulating said article; and
e. means for removing said etchant, said encapsulant dissolved by said etchant, and insoluble particles of said encapsulant which result from jet spraying said preselected portion of said encapsulant, with this means operably connected to said jet spray means and to said etchant flow controlling means;
whereby said preselected portion of said material is de-encapsulated.

2. An apparatus, as set forth in claim 1, wherein said jet spray means includes means for defining said preselected portion of said material encapsulating said article; and means, connected to said preselected portion defining means, for directing said jet spray of flowing etchant against said preselected portion of said material encapsulating said article.

3. An apparatus, as set forth in claim 2, wherein said means for controlling said flow of heated etchant from said source thereof to said receiving receptacle includes a selectively operable vacuum source connected to said receptacle, and an atmospheric vent connected to said source of heated etchant.

4. An apparatus, as set forth in claim 3, wherein:
a. said means for defining said preselected portion of said material encapsulating said article includes a washer which is made of chemically inert material and which has a hole therethrough of dimensions such that the hole surrounds said preselected portion of said encapsulant; and
b. said means for directing said jet spray of flowing heated etchant against said preselected portion of said material encapsulating said article includes a main tube of chemically inert material having an end opening disposed in the hole of said washer and a side opening operably connected to said etchant flow controlling means.

5. An apparatus, as set forth in claim 4, wherein said means for removing said etchant, said dissolved encapsulant, and said insoluable particles of said encapsulant includes a tapered capillary tube which is made of chemically inert material, which is positioned within said main tube, which has an upper open end in communication with said etchant flow controlling means, and which has a tapered lower open end disposed through said open end of said main tube and within the hole of said washer, thereby said etchant, said dissolved encapsulant, and said insoluble particles of said encapsulant are pulled through said capillary tube by said vacuum source and are introduced into said etchant flow controlling means.

6. An apparatus, as set forth in claim 2, wherein said apparatus further comprises means for simultaneously supporting said plastic encapsulated article, said jet spray causing means, and said means for removing said etchant, said dissolved encapsulant, and said insoluble particles of encapsulant.

7. An apparatus, as set forth in claim 2, wherein said apparatus further comprises:
a. at least one source of a heated rinse solution;
b. at least one receptacle in communication with said source of heated rinse solution for receiving and storing a flow of said heated rinse solution; and
c. means, common to and connected with said etchant flow controlling means, for permitting the selective flow either of said heated etchant or of said heated rinse solution from their respective sources to their respective receiving receptacles.

8. An apparatus, as set forth in claim 2, wherein said apparatus further comprises a plurality of sources of heated etchants, with each source containing a different predetermined etchant.

9. An apparatus, as set forth in claim 2, wherein said jet spray means, and said means for removing said etchant, said encapsulant dissolved in said etchant, and said insoluable particles of said encapsulant are joined to form a jet tube assembly.

10. An apparatus, as set forth in claim 2, wherein said preselected portion of said plastic encapsulating said article contains said article in its entirety.

* * * * *